(12) United States Patent
Ngwendson et al.

(10) Patent No.: US 11,239,351 B2
(45) Date of Patent: Feb. 1, 2022

(54) SEMICONDUCTOR DEVICE WITH A LOCOS TRENCH

(71) Applicants: Dynex Semiconductor Limited, Lincolnshire (GB); Zhuzhou CRRC Times Electric Co. Ltd., Hunan (CN)

(72) Inventors: Luther-King Ngwendson, Lincolnshire (GB); Ian Deviny, Lincolnshire (GB); John Hutchings, Lincolnshire (GB)

(73) Assignee: DYNEX SEMICONDUCTOR LIMITED, Hunan (CN)

( * ) Notice: Subject to any disclaimer, the term of this patent is extended or adjusted under 35 U.S.C. 154(b) by 0 days.

(21) Appl. No.: 16/615,502

(22) PCT Filed: Jan. 4, 2018

(86) PCT No.: PCT/GB2018/050012
§ 371 (c)(1),
(2) Date: Nov. 21, 2019

(87) PCT Pub. No.: WO2018/215729
PCT Pub. Date: Nov. 29, 2018

(65) Prior Publication Data
US 2020/0091328 A1    Mar. 19, 2020

(30) Foreign Application Priority Data

May 25, 2017    (WO) ................ PCT/GB2017/051492

(51) Int. Cl.
*H01L 29/739*    (2006.01)
*H01L 21/762*    (2006.01)
(Continued)

(52) U.S. Cl.
CPC .... *H01L 29/7397* (2013.01); *H01L 21/76205* (2013.01); *H01L 29/0696* (2013.01);
(Continued)

(58) Field of Classification Search
CPC ............. H01L 29/7397; H01L 29/0696; H01L 29/0804; H01L 29/1095; H01L 29/66325;
(Continued)

(56) References Cited

U.S. PATENT DOCUMENTS 7,303,961 B2    12/2007    Weber
2005/0242370 A1*    11/2005    Weber ................ H01L 29/7813
257/135
(Continued)

FOREIGN PATENT DOCUMENTS

DE    102015105335 A1    10/2015
EP        1760790 A1    3/2007
(Continued)

OTHER PUBLICATIONS

International Search Report and Written Opinion dated Mar. 20, 2018 for corresponding International Patent Application No. PCT/GB2018/050012.

*Primary Examiner* — Mohammed R Alam
(74) *Attorney, Agent, or Firm* — Tarolli, Sundheim, Covell & Tummino LLP

(57) ABSTRACT

A gate controlled semiconductor device comprising a collector region of a first conductivity type; a drift region of a second conductivity type located over the collector region; a body region of a first conductivity type located over the drift region; at least one first contact region of a second conductivity type located above the body region and having a higher doping concentration compared to the body region. The device further comprises at least one second contact region of a first conductivity type located laterally adjacent to the at least one first contact region, the at least one second contact region having a higher doping concentration than the body region. The device further comprises at least one active trench extending from a surface into the drift region, in which the at least one first contact region adjoins the at least (Continued)

one active trench so that, in use, a channel region is formed along said at least one active trench and within the body region. The at least one active trench comprises: two vertical sidewalls and a bottom surface between the two vertical sidewalls; and an insulation layer along the vertical side walls and the bottom surface, wherein the insulation layer along at least one vertical side wall comprises different thicknesses; at least one auxiliary trench extending from the surface into the drift region. The at least one auxiliary trench comprises: two vertical sidewalls and a bottom surface between the two vertical sidewalls; and an insulation layer along the vertical side walls and the bottom surface, wherein the insulation layer along at least one vertical side wall comprises a constant thickness.

20 Claims, 9 Drawing Sheets

(51) Int. Cl.
| | |
|---|---|
| *H01L 29/66* | (2006.01) |
| *H01L 29/06* | (2006.01) |
| *H01L 29/08* | (2006.01) |
| *H01L 29/10* | (2006.01) |

(52) U.S. Cl.
CPC ...... *H01L 29/0804* (2013.01); *H01L 29/1095* (2013.01); *H01L 29/66325* (2013.01); *H01L 29/66348* (2013.01); *H01L 29/7394* (2013.01)

(58) Field of Classification Search
CPC ......... H01L 21/76205; H01L 29/66348; H01L 29/7394; H01L 29/0623; H01L 29/407; H01L 29/42368; H01L 29/0834
See application file for complete search history.

(56) References Cited

U.S. PATENT DOCUMENTS

| | | |
|---|---|---|
| 2006/0060916 A1 | 3/2006 | Girdhar |
| 2009/0114966 A1 | 5/2009 | Renn |
| 2009/0206924 A1 | 8/2009 | Zeng |
| 2013/0256744 A1 | 10/2013 | Tang |
| 2015/0021656 A1 | 1/2015 | Kitagawa |
| 2016/0211257 A1* | 7/2016 | Yoshida ............... H01L 29/407 |
| 2017/0018636 A1 | 1/2017 | Naito |
| 2018/0108738 A1* | 4/2018 | Naito .................. H01L 29/1095 |

FOREIGN PATENT DOCUMENTS

| | | |
|---|---|---|
| WO | 0219434 A1 | 3/2002 |
| WO | 2006008888 A1 | 1/2006 |
| WO | 2018215727 A1 | 11/2018 |

* cited by examiner (a)

(b)

(c)

(d)

(e)

(f)

(g)

(h)

(i)

(j)

SEMICONDUCTOR DEVICE WITH A LOCOS TRENCH

RELATED APPLICATIONS

The present application is a U.S. National Stage application under 35 USC 371 of PCT Application Serial No. PCT/GB2018/050012, filed on 4 Jan. 2018; which claims priority from PCT Application Serial No. PCT/GB2017/051492, filed 25 May 2017, the entirety of all of which are incorporated herein by reference.

TECHNICAL FIELD

The present disclosure relates to a semiconductor device with a thick oxide on selective trench bottom and/or vertical side walls.

BACKGROUND

Power semiconductor devices are often used as switches as they operate in both on and off states. In the on-state a device can conduct high currents, and conduction losses are desired to be reduced. In the off-state a device can withstand the system maximum voltage with little or no current passing.

Insulated gate bipolar transistors (IGBTs) have the combined advantage of metal-oxide semiconductor (MOS) gate drive with the high current densities found in bipolar transistors. Bipolar transistors make use of conduction by majority and minority carriers. This means that bipolar transistors have a high density of charge carriers. This high level of charge reduces on-state conduction losses ($V_{CE(ON)}$), but increases switching losses ($E_{OFF}$) and switching time.

Previously devices have included a thick oxide on only the lower portion of the trench walls by LOCOS, as shown in U.S. Pat. No. 7,303,961. Furthermore, the method of forming the thick oxide results in thick oxide also forming between in the mesa region of the devices between trenches. Thick oxide in the mesa region may prevent the formation of source regions. However, thick oxide removal after the LOCOS step is complex, costly, and results in manufacturing yield loss.

Ion implantation damage has previously been used to produce devices with thick oxide along one trench sidewall, as shown in US 2009/0114966.

SUMMARY OF THE DISCLOSURE

Within IGBTs it is advantageous to provide thick oxide in regions not used as a conduction channel and to provide thin oxide in regions where conduction channels are formed. This reduces the gate collector capacitance ($C_{gc}$) and improves the switching speed. This reduces the turn on energy loss ($E_{ON}$) and the turn off energy loss ($E_{OFF}$). This thick oxide layer can be formed using of a technique/process called local oxidation of silicon (LOCOS).

The thick oxide improves immunity to high electric field stress and harnesses the device breakdown voltage. The high electric field stress can cause premature device breakdown, so the presence of the thick oxide is advantageous. Oxide breakdown electric field increases with oxide thickness. The thick oxide layer may have a thickness of between 2000 to 4000 kÅ. The thin oxide layer may have a thickness of between 500 to 2000 Å.

According to one aspect of the present disclosure, there is a gate controlled semiconductor device comprising:

a collector region of a first conductivity type;

a drift region of a second conductivity type located over the collector region;

a body region of a first conductivity type located over the drift region;

at least one first contact region of a second conductivity type located above the body region and having a higher doping concentration compared to the body region;

at least one second contact region of a first conductivity type located laterally adjacent to the at least one first contact region, the at least one second contact region having a higher doping concentration than the body region;

at least one active trench extending from a surface into the drift region, wherein the at least one first contact region adjoins the at least one active trench so that, in use, a channel region is formed along said at least one active trench and within the body region, and wherein the at least one active trench comprises:
two vertical sidewalls and a bottom surface between the two vertical sidewalls; and
an insulation layer along the vertical side walls and the bottom surface, wherein the insulation layer along at least one vertical side wall comprises different thicknesses;

at least one auxiliary trench extending from the surface into the drift region, and wherein the at least one auxiliary trench comprises:
two vertical sidewalls and a bottom surface between the two vertical sidewalls; and
an insulation layer along the vertical side walls and the bottom surface, wherein the insulation layer along at least one vertical side wall comprises a constant thickness.

Generally, a thin oxide layer in the trench bottom can suffer from premature breakdown under high electric fields, particularly if the n-well is significantly enhanced. The feature of trenches with a thick bottom oxide improves immunity to high electric field stress and harnesses the device breakdown voltage. Oxide breakdown electric field increases with oxide (or insulation layer) thickness. Here the insulation layer of the active trench having different thicknesses generally means that a relatively thin insulation layer (or oxide) is present along the channel area and a relatively thick insulation layer (or oxide) is present along the remaining portion of the trench (e.g. near the bottom side walls and the along the bottom surface). In one example, the insulation layer along one side wall has both thin and thick layers and the insulation layer along another side wall has only a thick layer. For the auxiliary trench, the insulation layer along both side walls can be thick. Alternatively, the insulation layer of the auxiliary trench along one side wall can be thick only (or having a constant thickness) and along another side wall can be both thin and thick (or having two thicknesses). Furthermore, the manufacturing process of the device enables the formation of trenches with two types of oxide configurations simultaneously, for example, symmetric and asymmetric thick oxide regions by the LOCOS technique.

The insulation layer along at least one vertical side wall of the auxiliary trench may comprise a greater thickness compared to the thickness of the insulation layer along the channel region of at least one active trench. The auxiliary trench is generally a dummy trench and therefore no channel region is formed in the auxiliary trench. Therefore no thin oxide region is formed in the auxiliary trench. The constant thickness oxide layer in the auxiliary trench has greater thickness (or thicker) than the thickness of the insulation layer of the active trench near the channel region (where the insulation layer is thin).

The active trenches may have a thick oxide layer or portion on vertical sidewall regions where conduction channels or accumulation layers are not formed. This reduces the gate collector capacitance ($C_{gc}$) and improves the switching speed. This lowers or reduces the turn on energy loss ($E_{ON}$), the turn off energy loss ($E_{OFF}$), and the gate charge.

The active trenches may not have a thin oxide layer on regions where electron conduction channels are formed. This improves the dynamic performance of the device.

In at least one active trench, the insulation layer along both vertical side walls may comprise different thicknesses.

In at least one active trench, the insulation layer along one vertical side wall may comprise different thicknesses and the insulation layer along another vertical side wall may comprise a constant thickness. In other words, this is an asymmetric trench oxide layer in the active trench. This is advantageous as this configuration allows a thick oxide layer where conduction channels or accumulation layers are not formed, but does not result in a thick oxide in regions where electron conduction channels are formed. This reduces the gate collector capacitance ($C_{gc}$), the gate charge and improves the switching speed. This lowers or reduces the turn on energy loss ($E_{ON}$) and the turn off energy loss ($E_{OFF}$). This improves the dynamic performance of the device.

Each vertical side wall of at least one active trench may comprise an upper portion and a lower portion.

The thickness of the insulation layer along the lower portion may be greater than the thickness of the insulation layer along the upper portion of each vertical side wall. This configuration allows a thick oxide layer on the lower portion and a thin oxide layer on the upper portion. This reduces the gate collector capacitance ($C_{gc}$), the gate charge and improves the switching speed. This lowers or reduces the turn on energy loss ($E_{ON}$) and the turn off energy loss ($E_{OFF}$). This improves the dynamic performance of the device.

The thickness of the insulation layer along the lower portion may be greater than thickness of the insulation layer along the upper portion of one vertical side wall, and for another vertical side wall, the thickness of the insulation layer along the lower portion and the upper portion may be the same. This configuration allows a thick oxide layer in regions where conduction channels are not formed, and a thin oxide layer in regions where there is no conduction channel.

The thickness of the insulation layer along the bottom surface of at least one active trench may be the same as the thickness of the insulation layer along the lower portion of both vertical side walls.

The channel region may be formed along the insulation layer along the upper portion.

The vertical length of the lower portion may be greater than the vertical length of the upper portion.

The ratio of the vertical length of the lower portion and the vertical length of the upper portion may be equal to or greater than 1. This ratio may be adjusted to alter $C_{gc}$. In this way the device performance can be adjusted.

In at least one auxiliary trench, the insulation layer along both vertical side walls may comprise a constant thickness.

Alternatively, in at least one auxiliary trench, the insulation layer along one vertical side wall comprises different thicknesses and the insulation layer along another vertical side wall comprises the constant thickness. Thick oxide along the sidewalls of an auxiliary trench can further reduce the capacitance contribution of the auxiliary trench.

The at least one auxiliary trench may be biased at a ground potential.

The at least one auxiliary trench may comprise at least one grounded auxiliary trench and at least one floating dummy trench.

The device may further comprise an emitter trench extending from the surface into the drift region, and the second contact region may adjoin the emitter trench.

The emitter trench may be located between two active trenches.

The device may be configured such that the emitter trench is biased at a ground potential.

The emitter trench may comprise:
two vertical sidewalls and a bottom surface between the two vertical sidewalls, and an insulation layer along the vertical side walls and the bottom surface.

The insulation layer along at least one vertical side wall of the emitter trench may comprise different thicknesses.

In the emitter trench, the insulation layer along both vertical side walls may comprise different thicknesses.

Alternatively, in the emitter trench, the insulation layer along one vertical side wall may comprise different thicknesses and the insulation layer along another vertical side wall may comprise a constant thickness.

Each vertical side wall of the emitter trench may comprise an upper portion and a lower portion.

The thickness of the insulation layer along the lower portion may be greater than the thickness of the insulation layer along the upper portion of each vertical side wall of the emitter trench.

The thickness of the insulation layer along the lower portion may be greater than the thickness of the insulation layer along the upper portion of one vertical side wall of the emitter trench, and for another vertical side wall of the emitter trench, the thickness of the insulation layer along the lower portion and the upper portion may be the same.

The device may not have a thick insulation layer formed in the region between trenches, known as the mesa region. Advantageously, if thick oxide is not formed in the mesa regions and the emitter trench, there is hole accumulation in these regions. During turn-off this allows the holes to flow closer to the emitter trench. This prevents latch-up and enhances the Safe Operating Area (SOA) of the device.

Thick oxide in the mesa region may prevent the formation of the source regions. Removal of the thick oxide after the LOCOS step is complex, costly, and results in manufacturing yield loss.

According to a further aspect of the present disclosure, there is provided a method of manufacturing a gate controlled semiconductor device, the method comprising:
forming a collector region of a first conductivity type;
forming a drift region of a second conductivity type over the collector region;
forming a body region of a first conductivity type over the drift region;
forming at least one first contact region of a second conductivity type above the body region and having a higher doping concentration compared to the body region;
forming at least one second contact region of a first conductivity type laterally adjacent to the at least one first contact region, the at least one second contact region having a higher doping concentration than the body region;
forming at least one active trench extending from a surface into the drift region, wherein the at least one first contact region adjoins the at least one active trench so that a channel region is formed along said at least one active trench and within the body region, and wherein the at least one active trench comprises: two vertical sidewalls and a bottom surface between the two vertical sidewalls; and an insulation layer along the vertical side walls and the bottom surface, wherein the insulation layer along at least one vertical side wall comprises different thicknesses;

forming at least one auxiliary trench extending from the surface into the drift region, and wherein the at least one auxiliary trench comprises: two vertical sidewalls and a bottom surface between the two vertical sidewalls; and an insulation layer along the vertical side walls and the bottom surface, wherein the insulation layer along at least one vertical side wall comprises a constant thickness.

The insulation layer along the at least one vertical side wall of the auxiliary trench may comprise a greater thickness compared to the thickness of the insulation layer along the channel region of the at least one active trench.

The method may further comprise forming an emitter trench extending from the surface into the drift region, and wherein the second contact region adjoins the emitter trench.

At least two of the active trench, emitter trench and auxiliary trench are manufactured using the steps of: performing an etching process to form at least two trenches laterally spaced from one another and forming a mesa region between two trenches; and depositing a filling material in the at least two trenches and on the mesa region;

The method may further comprise: providing a mask; partially etching the filling material such that an un-etched depth within the trench determines the dimension and regions for forming a thick insulation layer; depositing an oxidation barrier on top of the filling material and the sidewalls of the trenches; etching to remove the filling material and oxidation barrier which are not on the sidewalls of the trenches; and growing a thick insulation layer in regions which are not covered by an oxidation barrier.

One trench has an asymmetric trench insulation layer and another trench has a symmetric trench insulation layer.

The method may further comprise removing the oxidation barrier.

The method may further comprise depositing a filling material after growing the thick insulation layer.

Providing an oxidation barrier may comprise providing an oxidation barrier on a top surface of the device.

The method may further comprise providing an oxidation barrier between said adjacent trenches.

Providing an oxidation barrier on top of the filling material and the sidewalls of the trenches between said adjacent trenches may comprise depositing a single, connected oxidation barrier. The single, connected oxidation barrier may comprise a bridge between trenches.

The oxidation barrier may be a nitride layer.

The method may further comprise forming an insulation layer on the sidewalls of the trenches prior to depositing a filling material in the trenches.

The thick insulation layer may be grown using a local oxidation of silicon (LOCOS) process.

The insulation layer on the mesa region may be thinner than the insulation layer along the bottom surface of each trench.

The manufacturing process of the two trenches is advantageous because it is possible to prevent growing of thick oxide in silicon mesa region by a process that involves a formation of a nitride bridge between two nitride layers. Thick oxide in the mesa region can prevent the formation of the source region. It is therefore advantageous to prevent the growing of thick oxide in the mesa region removal of the thick oxide layer after the LOCOS step is complex, costly, and results in manufacturing yield loss.

BRIEF DESCRIPTION OF THE DRAWINGS/PREFERRED EMBODIMENTS

The present disclosure will be understood more fully from the detailed description that follows and from the accompanying drawings, which however, should not be taken to limit the disclosure to the specific embodiments shown, but are for explanation and understanding only.

Figure 6:
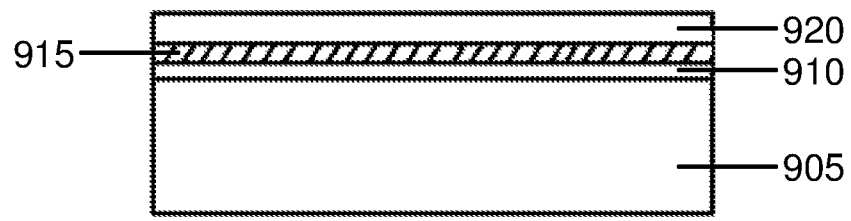
Figure 6:
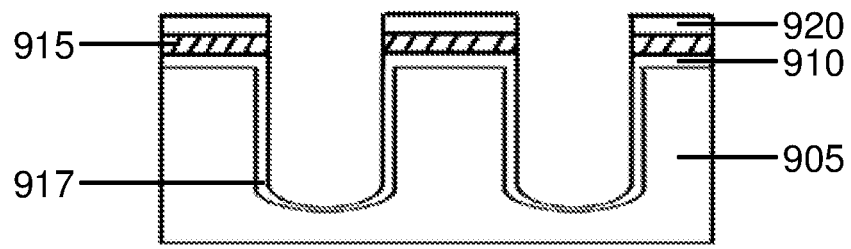
Figure 6:
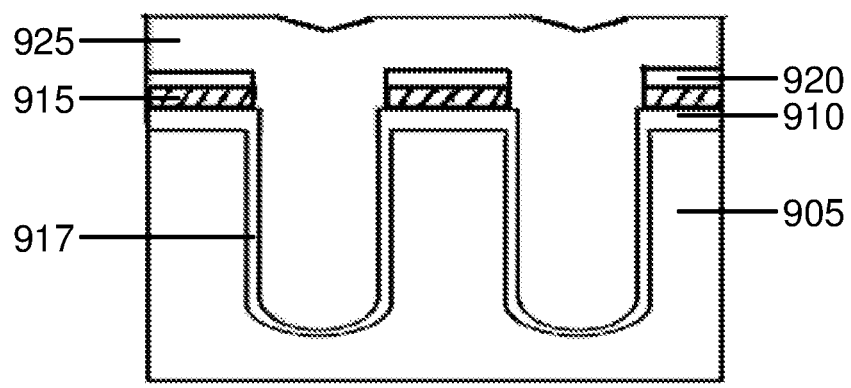
Figure 6:
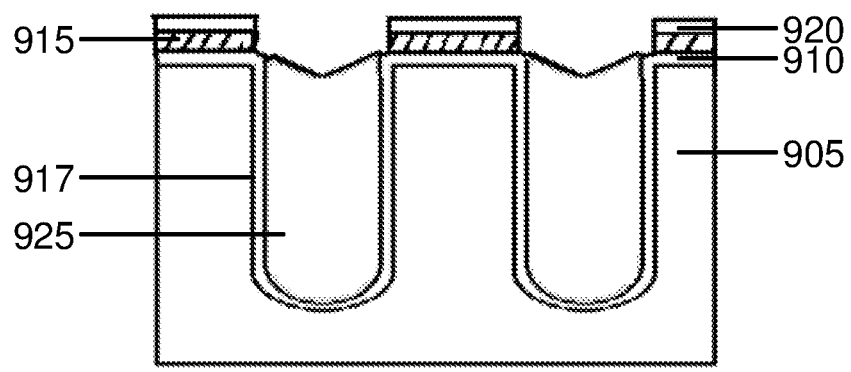
Figure 6:
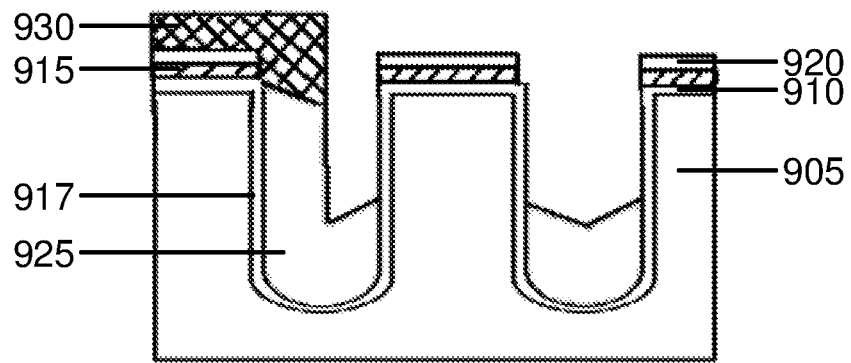
Figure 6:
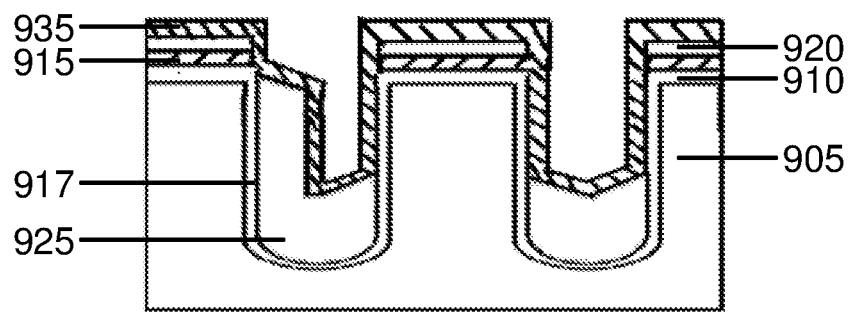
Figure 6:
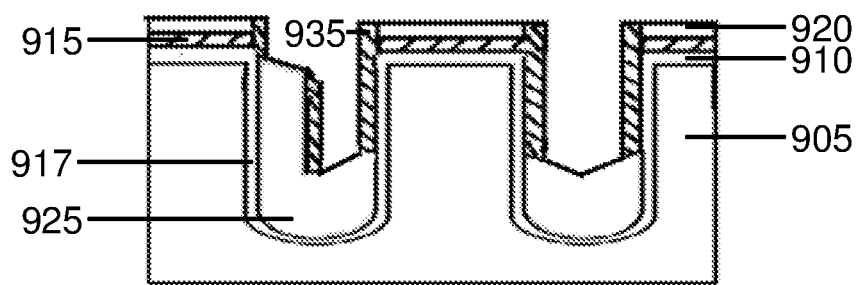
Figure 6:
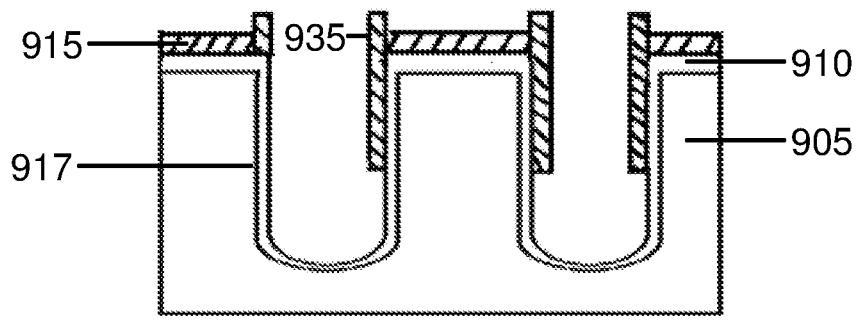
Figure 6:
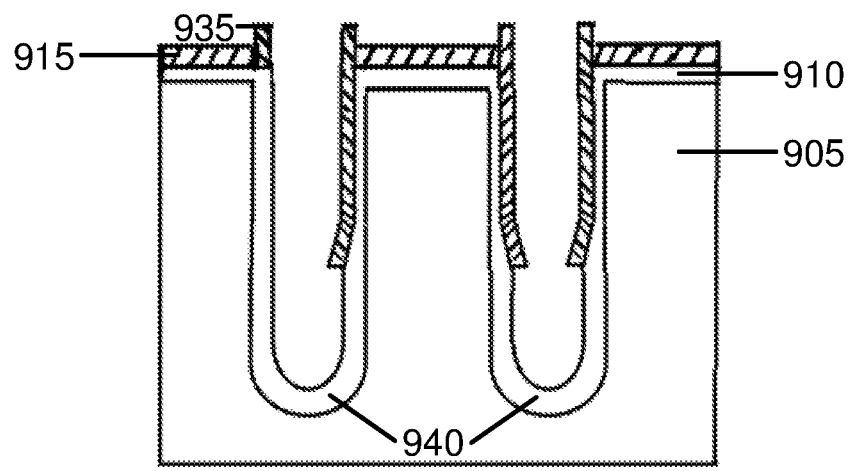
Figure 6:
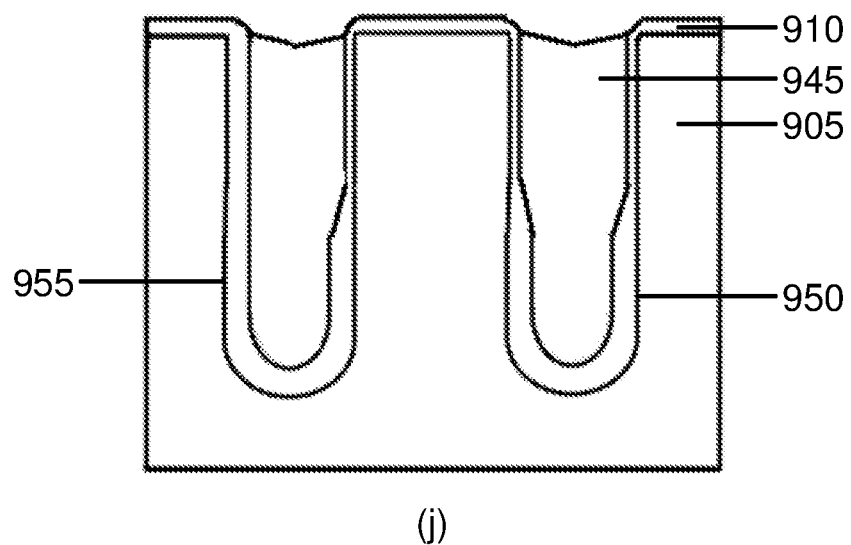
Figure 7:
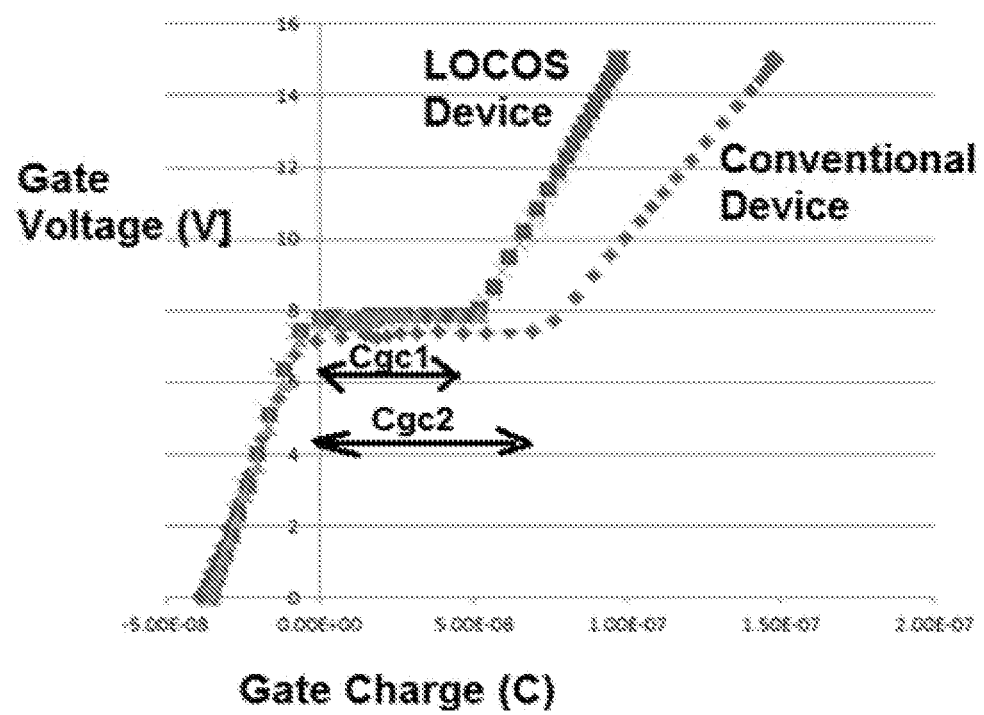

FIGS. 6(a) to 6(j) show a manufacturing process of symmetric and asymmetric oxide trench regions in which:

FIG. 6(a) illustrates the first steps of manufacturing two trenches;

FIG. 6(b) illustrates the second steps of manufacturing two trenches;

FIG. 6(c) illustrates the third step of manufacturing two trenches;

FIG. 6(d) illustrates the fourth step of manufacturing two trenches;

FIG. 6(e) illustrates the fifth steps of manufacturing two trenches;

FIG. 6(f) illustrates the sixth step of manufacturing two trenches;

FIG. 6(g) illustrates the seventh steps of manufacturing two trenches;

FIG. 6(h) illustrates the eighth steps of manufacturing two trenches;

FIG. 6(i) illustrates the ninth steps of manufacturing two trenches;

FIG. 6(j) illustrates the tenth steps of manufacturing two trenches;

FIG. 7 shows the reduction of gate collector capacitance ($C_{gc}$) in the present disclosure compared to conventional devices.

DETAILED DESCRIPTION OF EMBODIMENTS

Figure 1:
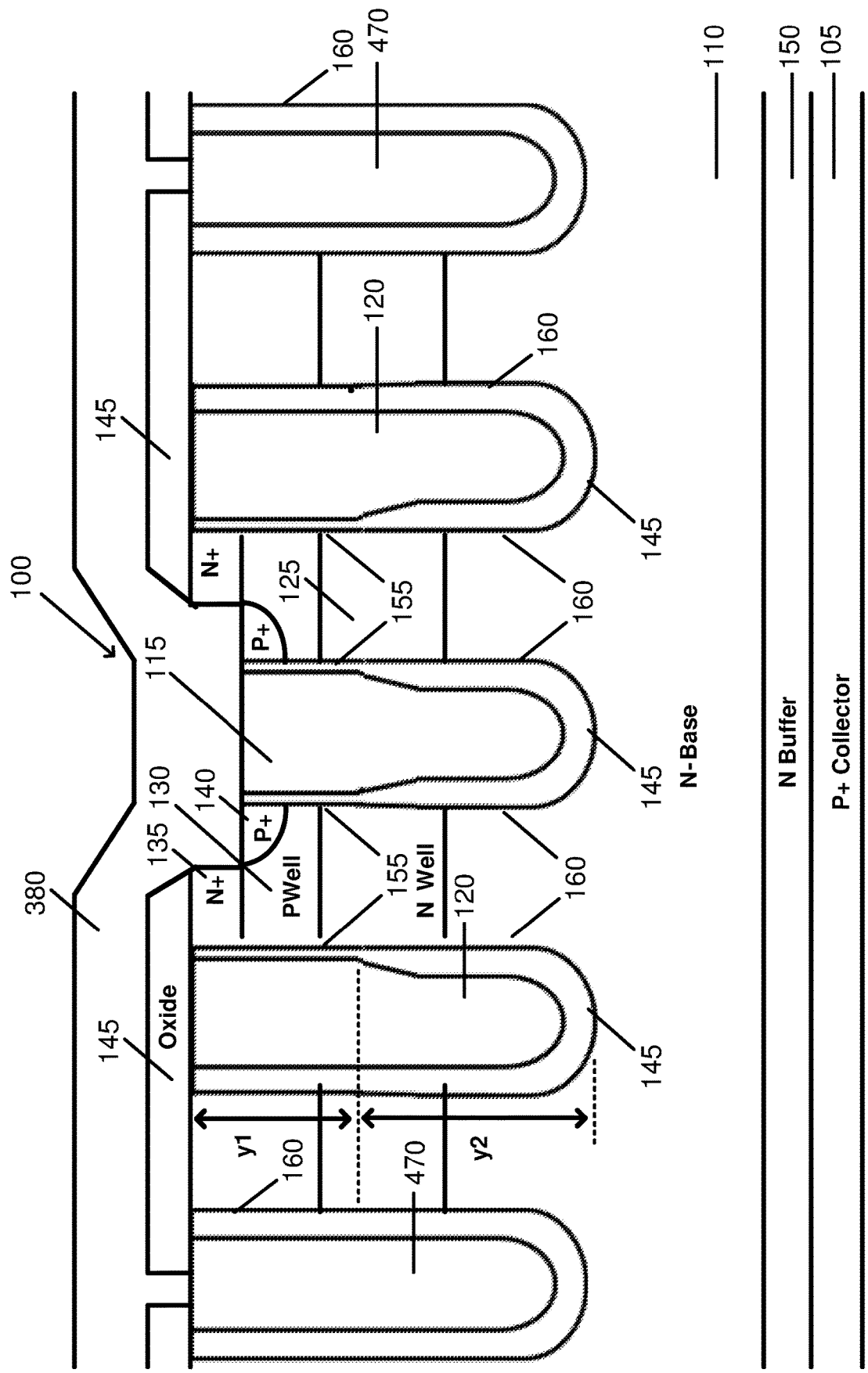
FIG. 1 illustrates a schematic cross-sectional view of a semiconductor device with selective trench oxide regions according to one embodiment.

FIG. 1 is a schematic cross-sectional view of a semiconductor device 100 with selective trench oxide regions according to one embodiment. In this embodiment, the device 100 comprises an n-type voltage sustaining region or n-base (or a drift region) 110 over a collector p+ layer (substrate) 105. The collector p+ layer 105 is, for example, a p-type diffusion on the backside that supplies holes in the on-state for bipolar conduction. The device 100 includes an active trench (or a first trench) 120 extending down into the n-base 110 from the surface of an n+ contact region (or a first contact region) 135. The active trench 120 acts as a trench gate along which a MOS channel is formed in an on-state by application of a positive voltage. Within the n-base 110 and adjacent to the active trench 120, there is provided a p-well or p-body (or a body region) 130. Within the p-base of p-body 130, the n+ contact region 135 of the emitter is formed.

In the embodiment of FIG. 1, an emitter trench 115 is formed which is laterally spaced from the active trench 120. In this embodiment, the emitter trench 115 is formed between two active trenches 120, extending down, recessed below a junction between the n+ contact region 135 of the emitter and the p-base (p-well region) 130. Each trench 115, 120 includes vertical sidewalls and a bottom surface between the vertical sidewalls. The active and emitter trenches 115, 120 can be doped polysilicon trenches with an oxide region on the side walls. The active trench 120 can also be a dielectric filled trench with a gate metal electrode within the trench. The emitter trench 115 can also be a dielectric filled trench with or without a metal electrode within.

In the embodiment of FIG. 1, underneath the p-base (p-well layer) 130, and in contact with both the p-base 130 and the n-base layer 110, there is an n-well layer 125. This n-well layer 125 acts as a charge storage (CS) layer. The emitter trench 115 is connected to the emitter metal (not shown). In one example, the emitter trench 115 is generally grounded in all modes of operation. The emitter and active gate trenches may have similar widths. However, different widths for the emitter and active gate trenches 115, 120 can be contemplated.

An emitter p+ contact layer (or the second contact region) 140 is formed above the A-base (p-well layer) 130. The p+ contact layer 140 is formed adjacent to the emitter trench 115. Given that the emitter trench 115 is recessed from the surface of the device, the p+ contact layer 140 is located a region below the N+ contact region 135.

In this embodiment, the active trenches 120 and emitter trench 115 have an oxide layer having two thicknesses. One portion of the oxide layer has a greater thickness compared to another portion of the same oxide layer. The oxide layer with the greater thickness is referred to as a thick oxide layer 145 and the oxide layer of the same trench having a smaller thickness is referred to as a thin oxide layer 155. The same definitions apply to all the embodiments of the specification. The thick oxide layer 145 is generally located along the bottom surface and low sides (or lower portion of the vertical sidewalls) of the polysilicon filled trenches 115, 120. The thin oxide layer 155 is generally located along the conduction channel region (which is located along the upper portion of the vertical side walls of the trench) of the device. The thick oxide layers 145 are formed by the local oxidation of silicon (LOCOS) technique. Generally, a thin oxide layer in the trench bottom can suffer from premature breakdown under high electric fields, particularly if the n-well is significantly enhanced. The feature of trenches with a thick bottom oxide 145 improves immunity to high electric field stress and harnesses the device breakdown voltage. Oxide breakdown electric field increases with oxide thickness.

The active trenches 120 and emitter trench 115 have the thin oxide layer 155 on the vertical sidewall regions where electron conduction channels are formed. The active trenches 120 have a thick oxide layer or portion 160 on vertical sidewall regions where conduction channels or accumulation layers are not formed. This reduces the gate collector capacitance ($C_{gc}$) and improves the switching speed. This lowers or reduces the turn on energy loss ($E_{ON}$) and the turn off energy loss ($E_{OFF}$). An oxide layer 145 may be formed over the regions of the device not connected to the emitter potential.

In this embodiment, the active trenches 120 have two side walls. The channel is formed along only one side wall and no conduction channel is formed along another side wall. The active trenches 120 have a thick oxide layer (or an oxide layer having a constant thickness) along a complete vertical sidewall of the trench, where the conduction channel is not formed. The active trenches 120 and the emitter trench 115 have a thick oxide layer 160 formed on the bottom surface and low sidewalls (of the trench), and a thin oxide layer 155 on the upper sidewalls where a conduction channel is formed.

The emitter and active trenches 115, 120 may be formed of (or may have) an upper portion and a lower portion. The upper portion extends for a length $y_1$ downwards from the surface of the trench. The lower portion extends for a length $y_2$ upwards from the bottom of the trench.

On trench sidewalls without a thick oxide layer on the upper portion, the transition from the thin oxide 155 to the thick oxide 160 on the vertical sidewalls of the trenches occurs at the boundary between the upper and lower portions. The transition occurs at a distance $y_1$ from the top of the active trenches. The distance from the bottom of the active trenches to the transition from the thin oxide 155 to the thick oxide 160 is given by $y_2$, in which generally $y_1/y_2 \geq 1$ and adjusting this ratio alters the $C_{gc}$. In this way, $y_1$ and $y_2$ can be adjusted to tune the device performance.

The values of $y_1$ and $y_2$ may vary for different trenches within the same device. $y_2$ may be greater than 0.5 μm. $y_1$ can be least as big as depth of p-well.

In this embodiment, two dummy trenches 470 are formed adjacent to the active trenches 120. The dummy trenches 470 have uniform thick oxide on the vertical sidewalls 160. This thick oxide further reduces the capacitance contribution of the dummy trench.

Figure 2:
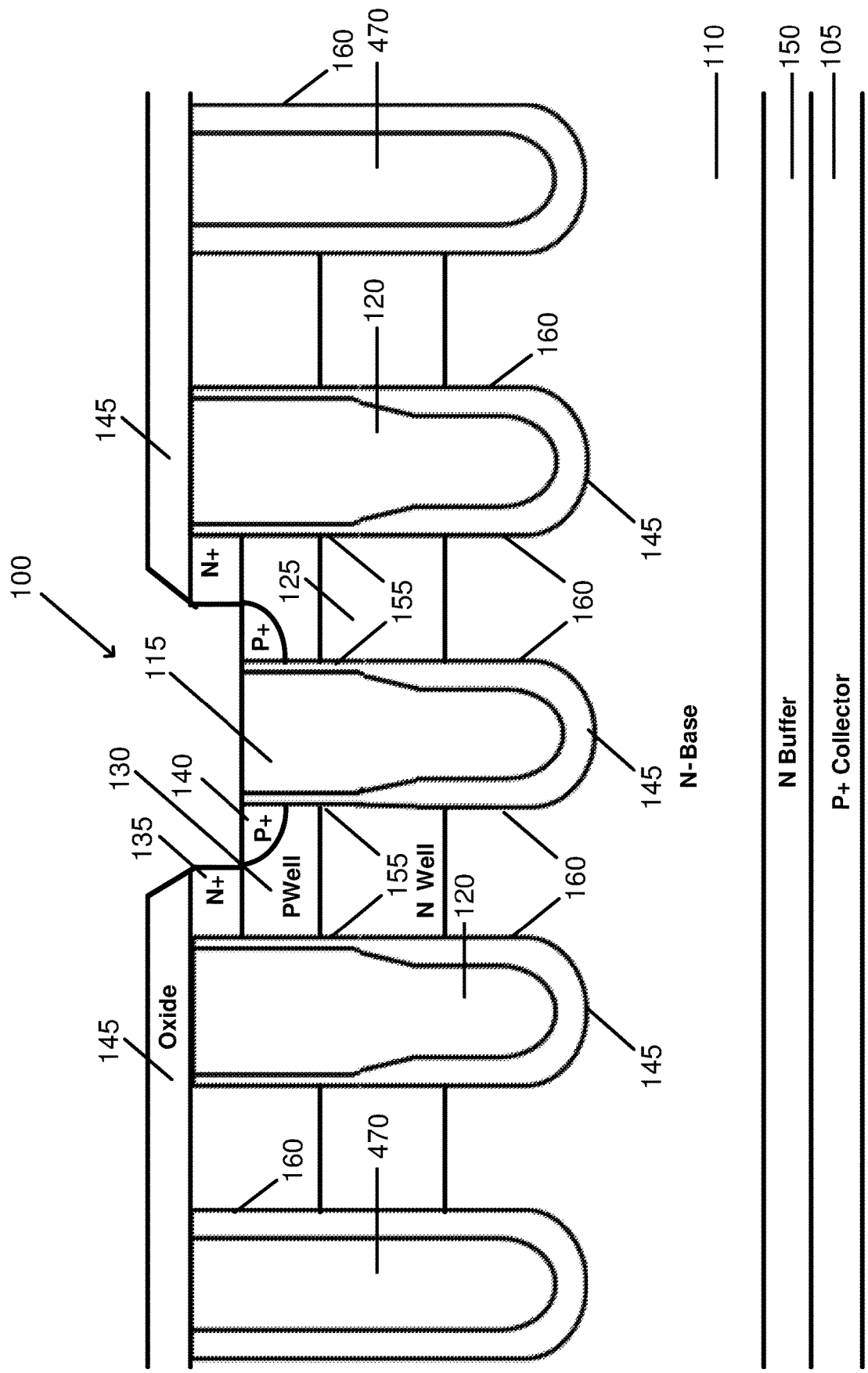
FIG. 2 illustrates a schematic cross-sectional view of an alternative semiconductor device with gate trenches with symmetric thick oxide according to one embodiment.

FIG. 2 is a schematic cross-sectional view of a semiconductor device 100 with gate trenches with symmetric thick oxide and one or more dummy trenches having complete (or constant thickness) oxide regions according to a further embodiment. Many features of this embodiment are the same as those shown in FIG. 1 and therefore carry the same reference numerals. The dummy trenches 470 have uniform thick oxide on the vertical sidewalls 160. The thick oxide further reduces the capacitance contribution of the dummy trench. This minimises the contribution of the dummy trenches (or auxiliary trenches) to gate collector capacitance ($C_{gc}$). In this embodiment, the active trenches 120 have a symmetric thick oxide.

Figure 3:
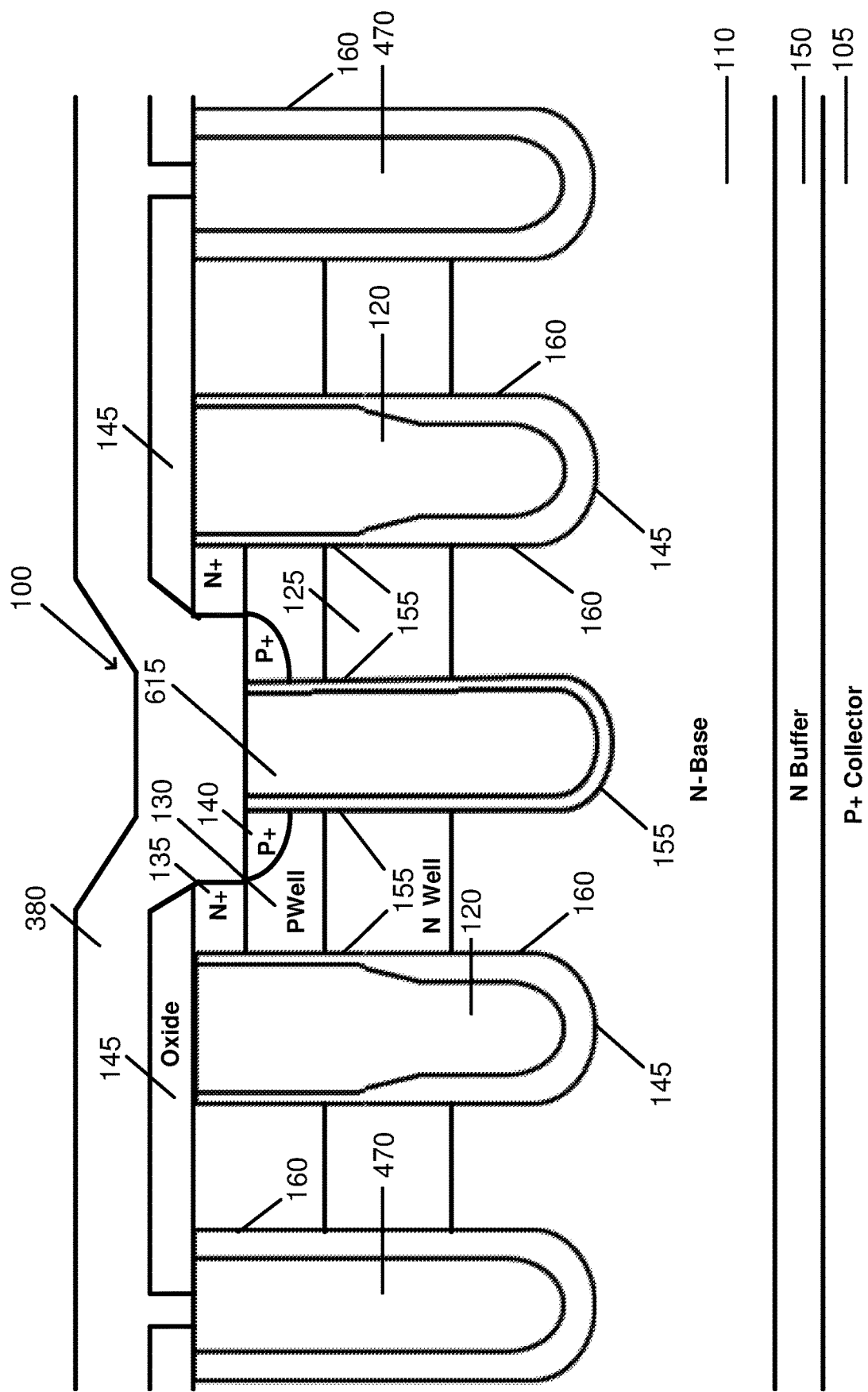
FIG. 3 illustrates a schematic cross-sectional view of an alternative semiconductor device with an emitter trench having a uniform thin oxide, one or more dummy trenches with complete thick oxide, and gate trenches with a symmetric thick oxide according to one embodiment.

FIG. 3 is a schematic cross-sectional view of a semiconductor device 100 with an emitter trench 615 having a uniform thin oxide 155 according to a further embodiment. Many features of this embodiment are the same as those shown in FIG. 1 and therefore carry the same reference numerals. The emitter trench 615 has the uniform thin oxide 155 along the bottom and vertical sidewalls. This improves the dynamic performance of the device. The thin oxide on the emitter trench allows a hole accumulation layer to be formed around the emitter trench, even with zero volts applied to it. Under dynamic conditions, holes prefer to flow along the low resistant accumulation layer to the emitter contact which improves turn-off current capability or RBSOA (Reverse Bias Safe Operating Area).

Figure 4:
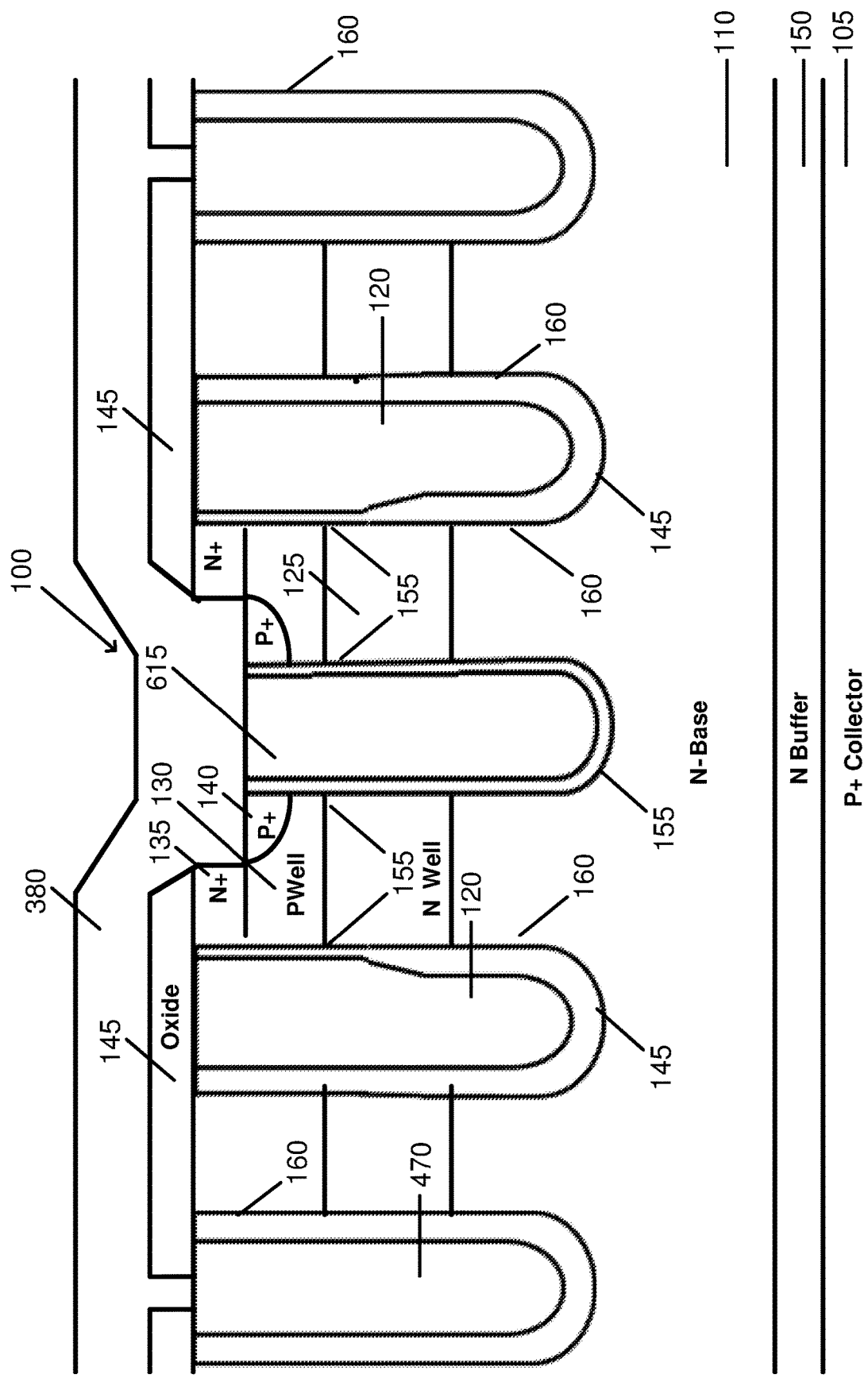
FIG. 4 illustrates a view of an alternative semiconductor device with an emitter trench having uniform thin oxide, one or more dummy trenches with complete thick oxide, and gate trenches with asymmetric thick oxide according to one embodiment.

FIG. 4 is a schematic cross-sectional view of a semiconductor device 100 with an emitter trench 615 having a uniform thin oxide according to a further embodiment. Many features of this embodiment are the same as those shown in FIG. 1 and therefore carry the same reference numerals. Similarly to FIG. 3, the emitter trench 615 has a uniform thin oxide 155 along the bottom and vertical sidewalls. This improves the dynamic performance of the device, especially the turn-on current capability or RBSOA of the device. The active trenches shown in this embodiment 120 have an asymmetric thick oxide. In this embodiment only the electron conduction channel region has thin oxide. This reduces the input capacitance ($C_{in}$) and $C_{gc}$. This results in reduced gate charge and faster turn-off and turn-on times, therefore reducing $E_{on}$ and $E_{off}$ respectively.

Figure 5:
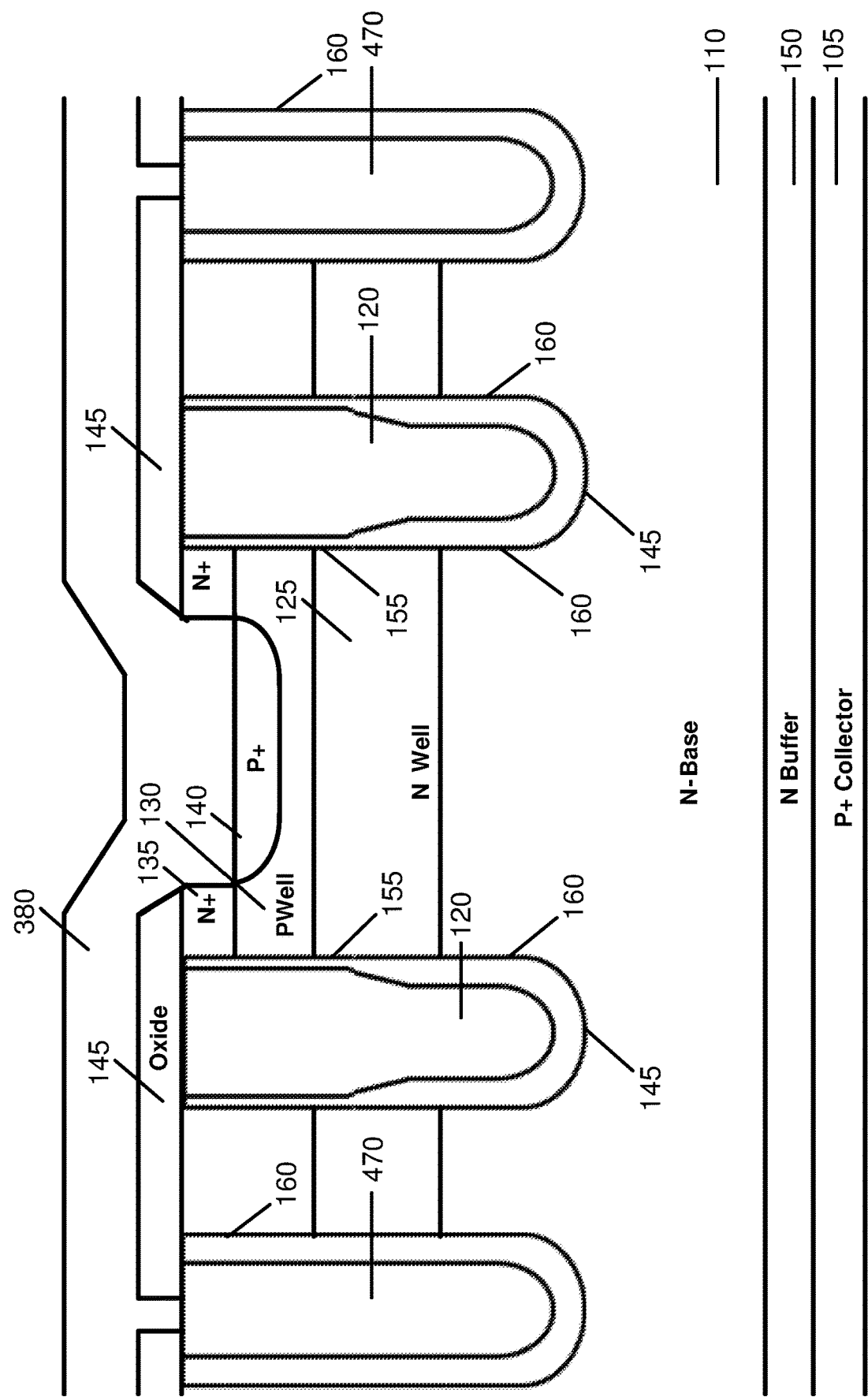
FIG. 5 illustrates a schematic cross-sectional view of an alternative semiconductor device with no emitter trench and with one or more grounded dummy trenches having constant thickness or complete oxide regions according to one embodiment.

FIG. 5 is a schematic cross sectional view of a semiconductor device 100 with one or more dummy trenches having complete oxide regions and with no emitter trench according to a further embodiment. Many features of this embodiment are the same as those shown in FIG. 1 and therefore carry the same reference numerals. The p+ emitter 140 extends between the n+ contact regions 135, and there is no emitter trench. The active trenches shown in this embodiment 120 have symmetric thick oxide. The grounded dummy trenches may have variable oxide thickness, similar to the active trenches. Additionally, the dummy trenches may comprise a combination of grounded and floating dummy trenches.

FIGS. 6(a) to 6(j) show a manufacturing process of a trench with asymmetric thick oxide and a trench with symmetric thick oxide.

FIG. 6(a) illustrates the first steps of manufacturing two trenches. The steps are as follows:
(a) Step 1
Oxide 1 910 (300-500 A) is deposited on a silicon substrate 905 by plasma chemical vapour deposition (PCVD) or furnace step: this is pad oxide for nitride-1 deposition;
Nitride 1 915 (1.5-2.0 kA) formed by plasma enhanced chemical vapour deposition (PECVD) or furnace is deposited on top of oxide1 910;
During LOCOS step 5, this nitride layer 915 prevents oxidation of regions between trenches where the emitter contact will be formed;
Oxide 2 920 formed by the PCVD is deposited on top of nitride1 915. This is used as a buffer to prevent erosion of nitride1 915 during subsequent steps 4, 5, 7, and 8.

FIG. 6(b) illustrates the second steps of manufacturing two trenches. The steps are as follows:
(b) Step 2
A photolithographic and then a dry etch step using plasma source to form trenches to desired depth in silicon substrate 905;
Sacrificial oxide 917 is formed on the trench sidewalls by the PECVD or oxidation;
There is no change in oxide2 920 thickness during this step.

FIG. 6(c) illustrates the third step of manufacturing two trenches. The steps are as follows:
(c) Step 3
Polysilicon 925 of required thickness is deposited to fill the trenches;

FIG. 6(d) illustrates the fourth step of manufacturing two trenches. The step is as follows:
(d) Step 4
The deposited polysilicon material 925 is etched back to level off with the silicon 905 between the trenches known as the mesa region.

FIG. 6(e) illustrates the fifth steps of manufacturing two trenches. The steps are as follows:
(e) Step 5
A photolithographic mask 930 exposes region of device where polysilicon 925 is to be etched. The polysilicon etch is controlled such that the remaining depth within the trench determines the dimension and regions that will have thick oxide formed during step 9.

FIG. 6(f) illustrates the sixth step of manufacturing two trenches. The step is as follows:
(f) Step 6
Nitride2 (1.5-2.0 kA) 935 is formed by the PECVD or by furnace over the entire top surface. This nitride2 layer forms a bridge between adjacent trenches.

FIG. 6(g) illustrates the seventh steps of manufacturing two trenches. The steps are as follows:
(g) Step 7
A blanket plasma etch of Nitride 2 935 is performed;
Only Nitride2 935 along the vertical side walls remain after this etch.

FIG. 6(h) illustrates the eighth steps of manufacturing two trenches. The steps are as follows:
(h) Step 8
Isotropic plasma etch is used to etch the remaining polysilicon 925 within the trenches;
All regions with Nitride 2 935 will not have the thick oxide formed on them;
Nitride 2 935 along the sidewalls of the trench will remain after this etch and defines the regions of the trench which will not have thick oxide formed on them.

FIG. 6(i) illustrates the ninth steps of manufacturing two trenches. The steps are as follows:
(i) Step 9
Thick (2000-5000 A) oxide 940 is grown in a furnace using wet oxidation. This is a process where a nitride layer 935 defines the regions where thick oxide will not grow. This is known as LOCOS (Local Oxidation of Silicon)

FIG. 6(j) illustrates the tenth steps of manufacturing two trenches. The steps are as follows:
(j) Step 10
Nitride2 935 is etched in Phosphoric acid;
Sacrificial oxide 917 that was under nitride2 935 is etched by dilute hydrofluoric acid to expose silicon 905;
Thin gate oxide is grown by a furnace step over exposed silicon area;
Doped polysilicon 945 is deposited and planarised according to steps 3 and 4 to form devices areas as normal in trench gate IGBTs and MOSFETs processing;
This forms a trench with asymmetric thick oxide regions 955 and a trench with symmetric thick oxide regions 950.

FIG. 7 shows the reduction of gate collector capacitance ($C_{gc}$) in the present disclosure compared to conventional devices. As can be seen, in the LOCOS devices, it is possible to achieve Cres (Cgc) improving devices such as IGBT/MOSFETs switching speed reducing Eoff/Eon.

The skilled person will understand that in the preceding description and appended claims, positional terms such as 'above', 'overlap', 'under', 'lateral', etc. are made with reference to conceptual illustrations of an apparatus, such as those showing standard cross-sectional perspectives and those shown in the appended drawings. These terms are used for ease of reference but are not intended to be of limiting nature. These terms are therefore to be understood as referring to a device when in an orientation as shown in the accompanying drawings.

It will be appreciated that all doping polarities mentioned above could be reversed, the resulting devices still being in accordance with embodiments of the present invention.

Although the disclosure has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in the disclosure, whether alone or in any appropriate combination with any other feature disclosed or illustrated herein.

The invention claimed is:

1. A gate controlled semiconductor device comprising:
    a collector region of a first conductivity type;
    a drift region of a second conductivity type located over the collector region;
    a body region of a first conductivity type located over the drift region;
    at least one first contact region of a second conductivity type located above the body region and having a higher doping concentration compared to the body region;
    at least one second contact region of a first conductivity type located laterally adjacent to the at least one first contact region, the at least one second contact region having a higher doping concentration than the body region;
    at least one active trench extending from a surface into the drift region, wherein the at least one first contact region adjoins the at least one active trench so that, in use, a channel region is formed along said at least one active trench and within the body region, and
    wherein the at least one active trench comprises:
        two vertical sidewalls and a bottom surface between the two vertical sidewalls; and
        an insulation layer along the two vertical sidewalls and the bottom surface, wherein the insulation layer along at least one vertical sidewall comprises different thicknesses;
    at least one auxiliary trench extending from the surface into the drift region, and wherein the at least one auxiliary trench comprises:
        two vertical sidewalls and a bottom surface between the two vertical sidewalls; and
        an insulation layer along the two vertical sidewalls and the bottom surface, wherein the insulation layer along one vertical sidewall comprises different thicknesses and the insulation layer along another vertical sidewall comprises a constant thickness.

2. The device according to claim 1, wherein the device is configured such that the at least one auxiliary trench is biased at a ground potential.

3. The device according to claim 1, wherein the insulation layer along said at least one vertical sidewall of the auxiliary trench comprises a greater thickness compared to the thickness of the insulation layer along the channel region of the at least one active trench.

4. The device according to claim 1, wherein, in the at least one active trench, the insulation layer along both vertical sidewalls comprises different thicknesses; or wherein, in the at least one active trench, the insulation layer along one vertical sidewall comprises different thicknesses and the insulation layer along another vertical sidewall comprises a constant thickness.

5. The device according to claim 1, wherein each vertical sidewall of the at least one active trench comprises an upper portion and a lower portion; and optionally wherein the thickness of the insulation layer along the lower portion is greater than the thickness of the insulation layer along the upper portion of each vertical sidewall; or
    wherein the thickness of the insulation layer along the lower portion is greater than thickness of the insulation layer along the upper portion of one vertical sidewall, and wherein, for another vertical sidewall, the thickness of the insulation layer along the lower portion and the upper portion is the same.

6. The device according to claim 5, wherein the thickness of the insulation layer along the bottom surface of the at least one active trench is the same as the thickness of the insulation layer along the lower portion of both vertical sidewalls; and/or wherein the channel region is formed along the insulation layer along the upper portion.

7. The device according to claim 5, wherein the vertical length of the lower portion is greater than the vertical length of the upper portion; and optionally wherein the ratio of the vertical length of the lower portion and the vertical length of the upper portion is equal to or greater than 1.

8. The device according to claim 1, further comprising an emitter trench extending from the surface into the drift region, and wherein the second contact region adjoins the emitter trench; and optionally wherein the emitter trench is located between two active trenches; and/or wherein the device is configured such that the emitter trench is biased at a ground potential.

9. The device according to claim 8, wherein the emitter trench comprises: two vertical sidewalls and a bottom surface between the two vertical sidewalls, and an insulation layer along the two vertical sidewalls and the bottom surface; and optionally wherein the insulation layer along at least one vertical sidewall comprises different thicknesses.

10. The device according to claim 9, wherein, in the emitter trench, the insulation layer along both vertical sidewalls comprise different thicknesses; or wherein, in the emitter trench, the insulation layer along one vertical sidewall comprises different thicknesses and the insulation layer along another vertical sidewall comprises a constant thickness.

11. The device according to claim 9, wherein each vertical sidewall of the emitter trench comprises an upper portion and a lower portion; and optionally wherein the thickness of the insulation layer along the lower portion is greater than the thickness of the insulation layer along the upper portion of each vertical sidewall; or
    wherein the thickness of the insulation layer along the lower portion is greater than the thickness of the insulation layer along the upper portion of one vertical sidewall, and wherein, for another vertical sidewall, the thickness of the insulation layer along the lower portion and the upper portion is the same.

12. The device according to claim 11, wherein the thickness of the insulation layer along the bottom surface of the emitter trench is the same as the thickness of the insulation layer along the lower portion of both vertical sidewalls.

13. A method of manufacturing a gate controlled semiconductor device, the method comprising:
forming a collector region of a first conductivity type;
forming a drift region of a second conductivity type over the collector region;
forming a body region of a first conductivity type over the drift region;
forming at least one first contact region of a second conductivity type above the body region and having a higher doping concentration compared to the body region;
forming at least one second contact region of a first conductivity type laterally adjacent to the at least one first contact region, the at least one second contact region having a higher doping concentration than the body region;
forming at least one active trench extending from a surface into the drift region, wherein the at least one first contact region adjoins the at least one active trench so that a channel region is formed along said at least one active trench and within the body region, and
wherein the at least one active trench comprises: two vertical sidewalls and a bottom surface between the two vertical sidewalls; and an insulation layer along the two vertical sidewalls and the bottom surface, wherein the insulation layer along at least one vertical sidewall comprises different thicknesses;
forming at least one auxiliary trench extending from the surface into the drift region, and
wherein the at least one auxiliary trench comprises: two vertical sidewalls and a bottom surface between the two vertical sidewalls; and an insulation layer along the two vertical sidewalls and the bottom surface, wherein the insulation layer along one vertical sidewall comprises different thicknesses and the insulation layer along another vertical sidewall comprises a constant thickness.

14. The method according to claim 13, wherein the insulation layer along said at least one vertical sidewall of the auxiliary trench comprises a greater thickness compared to the thickness of the insulation layer along the channel region of the at least one active trench; and/or further comprising forming an emitter trench extending from the surface into the drift region, and wherein the second contact region adjoins the emitter trench.

15. A method of manufacturing a gate controlled semiconductor device, the method comprising:
forming a collector region of a first conductivity type;
forming a drift region of a second conductivity type over the collector region;
forming a body region of a first conductivity type over the drift region;
forming at least one first contact region of a second conductivity type above the body region and having a higher doping concentration compared to the body region;
forming at least one second contact region of a first conductivity type laterally adjacent to the at least one first contact region, the at least one second contact region having a higher doping concentration than the body region;
forming at least one active trench extending from a surface into the drift region, wherein the at least one first contact region adjoins the at least one active trench so that a channel region is formed along said at least one active trench and within the body region, and
wherein the at least one active trench comprises: two vertical sidewalls and a bottom surface between the two vertical sidewalls; and an insulation layer along the two vertical sidewalls and the bottom surface, wherein the insulation layer along at least one vertical sidewall comprises different thicknesses;
forming at least one auxiliary trench extending from the surface into the drift region, and
wherein the at least one auxiliary trench comprises: two vertical sidewalls and a bottom surface between the two vertical sidewalls; and an insulation layer along the two vertical sidewalls and the bottom surface, wherein the insulation layer along at least one vertical sidewall comprises a constant thickness;
wherein at least two trenches of the at least one active trench and the at least one auxiliary trench are manufactured using the steps of:
performing an etching process to form the two trenches laterally spaced from one another and forming a mesa region between the two trenches;
then after performing the etching process, forming an insulation layer on the sidewalls of the two trenches;
then after forming the insulation layer on the sidewalls of the two trenches:
depositing a first filling material in the at least two trenches and on the mesa region;
providing a mask;
partially etching the first filling material such that an un-etched depth within the two trenches determines the dimension and regions for forming a thick insulation layer;
depositing an oxidation barrier on top of the first filling material and the sidewalls of the two trenches;
etching to remove the first filling material and oxidation barrier which are not on the sidewalls of the two trenches; and
growing a thick insulation layer in regions which are not covered by the oxidation barrier.

16. The method according to claim 15, wherein one trench of the two trenches has an asymmetric trench insulation layer and another trench of the two trenches has a symmetric trench insulation layer.

17. The method according to claim 15, further comprising removing the oxidation barrier; and/or further comprising depositing a second filling material after growing the thick insulation layer; and/or
wherein depositing an oxidation barrier comprises providing an oxidation barrier on a top surface of the gate controlled semiconductor device.

18. The method according to claim 15, further comprising depositing an oxidation barrier between adjacent trenches of the two trenches; and optionally wherein depositing an oxidation barrier on top of the first filling material and the sidewalls of the two trenches and depositing an oxidation barrier between said adjacent trenches comprises depositing a single, connected oxidation barrier to form a bridge.

19. The method according to claim 15, wherein the oxidation barrier is a nitride layer; and/or
wherein the thick insulation layer is grown using a local oxidation of silicon (LOCOS) process; and/or
wherein the insulation layer on the mesa region is thinner than the insulation layer along the bottom surface of the at least two trenches.

20. The device according to claim 1, wherein the device further comprises a body region of a second conductivity type located between the drift region and the body region of a first conductivity type.

* * * * *